(12) United States Patent
Cheong et al.

(10) Patent No.: US 7,094,615 B2
(45) Date of Patent: Aug. 22, 2006

(54) METHOD OF CONTROLLING PROBE TIP SANDING IN SEMICONDUCTOR DEVICE TESTING EQUIPMENT

(75) Inventors: Kwang-Yung Cheong, Chunan (KR); Jun-Sung Kim, Seoul (KR); Byung-Wook Choi, Seoul (KR)

(73) Assignee: Samsung Electronics, Co., Ltd., (KR)

( * ) Notice: Subject to any disclaimer, the term of this patent is extended or adjusted under 35 U.S.C. 154(b) by 468 days.

(21) Appl. No.: 10/649,250

(22) Filed: Aug. 26, 2003

(65) Prior Publication Data

US 2004/0051519 A1    Mar. 18, 2004

(30) Foreign Application Priority Data

Sep. 17, 2002  (KR) .............................. 2002-56333

(51) Int. Cl.
  *G01R 31/26* (2006.01)
  *H01L 21/66* (2006.01)
(52) U.S. Cl. .......... 438/14; 257/E21.521; 257/E21.529
(58) Field of Classification Search .................. 438/14, 438/FOR. 101, FOR. 142; 257/E21.521, 257/E21.529
See application file for complete search history.

(56) References Cited

U.S. PATENT DOCUMENTS 6,265,232 B1    7/2001    Simmons ...................... 438/14
6,366,100 B1 *  4/2002    Ito et al. ...................... 324/750

\* cited by examiner

*Primary Examiner*—Michelle Estrada
(74) *Attorney, Agent, or Firm*—Mills & Onello LLP

(57) ABSTRACT

In a method of and apparatus for controlling probe tip sanding in semiconductor device testing equipment, resistance values of pads of a probed chip are measured and stored. If a maximum resistance value among the stored resistance values is greater than a contact resistance reference value, a consecutive fail counting value and an accumulated fail counting value are increased. An automatic sanding command is generated to activate automatic sanding of a probe tip, when at least one of the consecutive fail counting value and the accumulated fail counting value is greater than a respective counting reference value. In this manner, false negative readings in the testing of semiconductor devices as the result of increased contact resistance between a probe tip and a pad in an EDS test are reduced and therefore device yield is improved.

6 Claims, 7 Drawing Sheets

METHOD OF CONTROLLING PROBE TIP SANDING IN SEMICONDUCTOR DEVICE TESTING EQUIPMENT

BACKGROUND OF THE INVENTION

1. Field of the Invention

The present invention relates to test equipment for a semiconductor device; and more particularly, to a probe tip sanding control method and apparatus.

2. Description of the Related Art

An electrical die sorting (EDS) test for the testing of semiconductor devices is well-known in the art, and is performed at the wafer level, as opposed to the package level. At the wafer level, the semiconductor device has not yet been placed in a package, and therefore does not include leads. Thus, the EDS test employs a probe card having probe tips that access device circuitry. When a probe card tip is in contact with a pad of the semiconductor device, alumina oxide $Al_2O_3$, a primary component of the pad, becomes attached to the tip, and therefore contact resistance is increased. This augmented contact resistance disturbs normal contact in an open/short(O/S) test as one of basic DC measurements, affects the linearity of an analog-to-digital converter (ADC) and a digital-to-analog converter (DAC) utilized in an analog block test, and affects certain measuring procedures, such as a gain error etc. This, in turn, can lead to erroneous readings as to whether a device under test meets the criteria for proper operation. Therefore, a normal semiconductor device can be dismissed as a bad part as a result of the test procedure, which, in turn, can have an adverse effect on yield, and therefore leads to a rise in manufacturing costs.

If the yield is reduced below a minimum threshold yield set as an initial parameter of the test, the test equipment automatically stops the testing operation. Such a yield reduction caused by an augment of the tip contact resistance drops can therefore affect even the operating rate of the equipment.

To solve such yield reduction and operating rate decrease, conventionally, probe tip sanding is uniformly executed, for example periodically, or following a test, through a sanding command issued by a operator. Since the pad material can be different from one pad to the next as a result of fabrication processes, the resulting yield is therefore subject to the discretion of the test operator.

In the meantime, frequent sanding of the probe tip slows down the test procedure, owing to increased time required for tip sanding, and, in addition, the useful life span of the probe tip is shortened.

SUMMARY OF THE INVENTION

An object of the present invention is to provide a method of controlling probe tip sanding in semiconductor device test equipment, which is capable of mitigating or eliminating the limitations associated with the conventional approaches.

Another object of the present invention is to provide a sanding control apparatus for semiconductor device test equipment, which is capable of optimizing the sanding period of a probe tip.

Another object of the present invention is to provide a method and apparatus for controlling probe tip sanding in semiconductor device test equipment, in order to minimize false negative readings related to the proper operation of semiconductor devices under test caused by the augmentation of contact resistance between a probe tip and a pad in an EDS test.

An additional object of the present invention is to provide a method and apparatus for controlling probe tip sanding for semiconductor device testing equipment, in order to reduce the overall testing time and in order to optimize the useful life of the probe tip by performing probe tip sanding periodically over an optimized period.

In accordance with one aspect of the present invention, a method of controlling probe tip sanding in semiconductor device testing equipment is provided. Resistance values of pads of a probed chip are measured and stored. If a maximum resistance value among the stored resistance values is greater than a contact resistance reference value, a consecutive fail counting value and an accumulated fail counting value are increased. An automatic sanding command is generated to activate automatic sanding of a probe tip, when at least one of the consecutive fail counting value and the accumulated fail counting value is greater than a respective counting reference value.

The measuring and storing of resistance values of pads of a probed chip preferably occurs at a wafer level.

The contact resistance reference value is preferably determined by: accumulating the resistance values measured by a resistance value measure program and obtaining a mean value during a pad open/short test for at least one die; and summing the mean value with an allowed resistance error value.

The counting reference value corresponding to the consecutive fail counting value is preferably determined statistically. Also. The counting reference value corresponding to the accumulated fail counting value is preferably determined statistically.

The probe tip sanding is performed, for example, in an EDS test process.

In another aspect, the present invention is directed to an apparatus for controlling probe tip sanding in semiconductor device testing equipment. The apparatus includes a sanding mechanism for sanding probe tips of a probe card. A controller measures and stores resistance values of pads of a probed chip, and increases a consecutive fail counting value and an accumulated fail counting value when a maximum resistance value among the stored resistance values is greater than a contact resistance reference value, and generates an automatic sanding command to activate the sanding mechanism, when at least one of the consecutive fail counting value and accumulated fail counting value is greater than a respective counting reference value.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

A method of and apparatus for controlling probe tip sanding in semiconductor device testing equipment are described as follows in accordance with an exemplary embodiment of the present invention.

Figure 1:
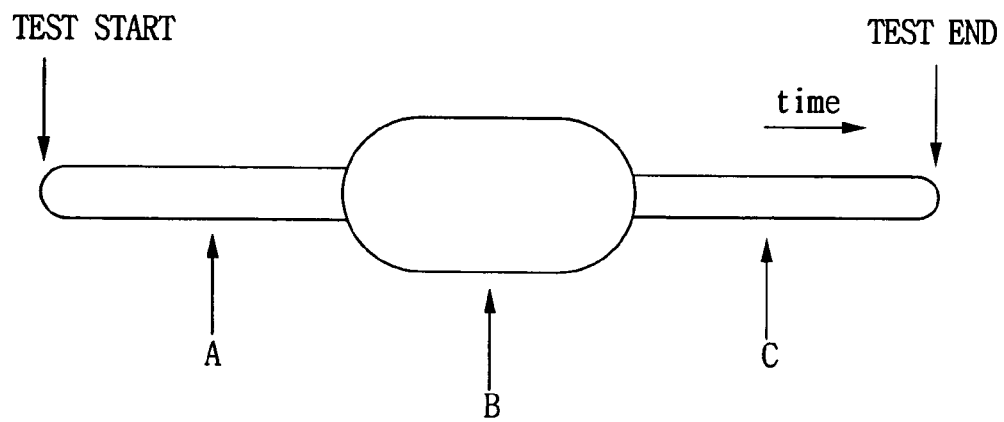
FIG. 1 illustrates the optimization of a sanding period of a probe tip in an EDS test, in accordance with the present invention.

FIG. 1 is a timing diagram that explains the optimization of the probe tip sanding period in an EDS test, in accordance with the present invention. The diagram illustrates three significant sanding periodic points A,B,C between a start point TEST START and an end point TEST END of the test. If sanding of the probe tip is performed at the periodic point A, overall testing time of the test equipment is prolonged owing to the selection of too rapid a sanding period, and the useful life span of the probe tip is shortened. If sanding is performed at the periodic point C, the period is too long, and buildup of alumina oxide on the tip can cause false negative test readings, and a drop in the operating rate of the test equipment due to an increase in contact resistance. Meanwhile, if sanding is performed at the periodic point B, the sanding period can be optimized without the problems caused at the periodic points A and C. Therefore, it is desired that the optimized sanding period be determined and that sanding be performed at that rate.

Figure 2:
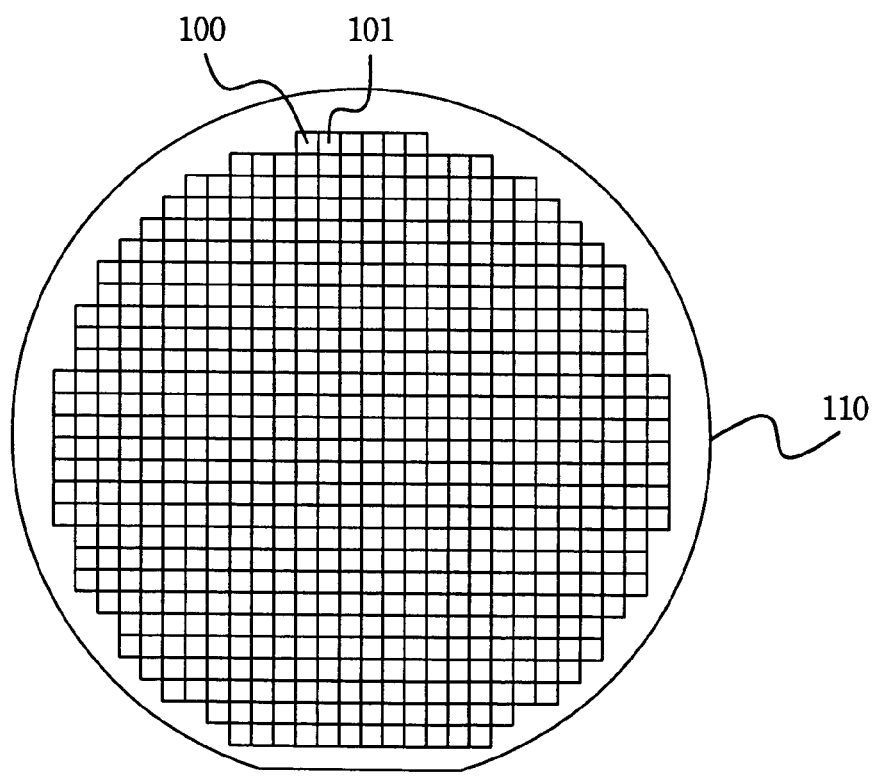
FIG. 2 is an illustration of a wafer under test, in accordance with the present invention.

FIG. 2 illustrates circuit chips under test on a wafer. The wafer 110 includes a plurality of chips 100, 101. A chip 100 is generally configured as shown in FIG. 3.

Figure 3:
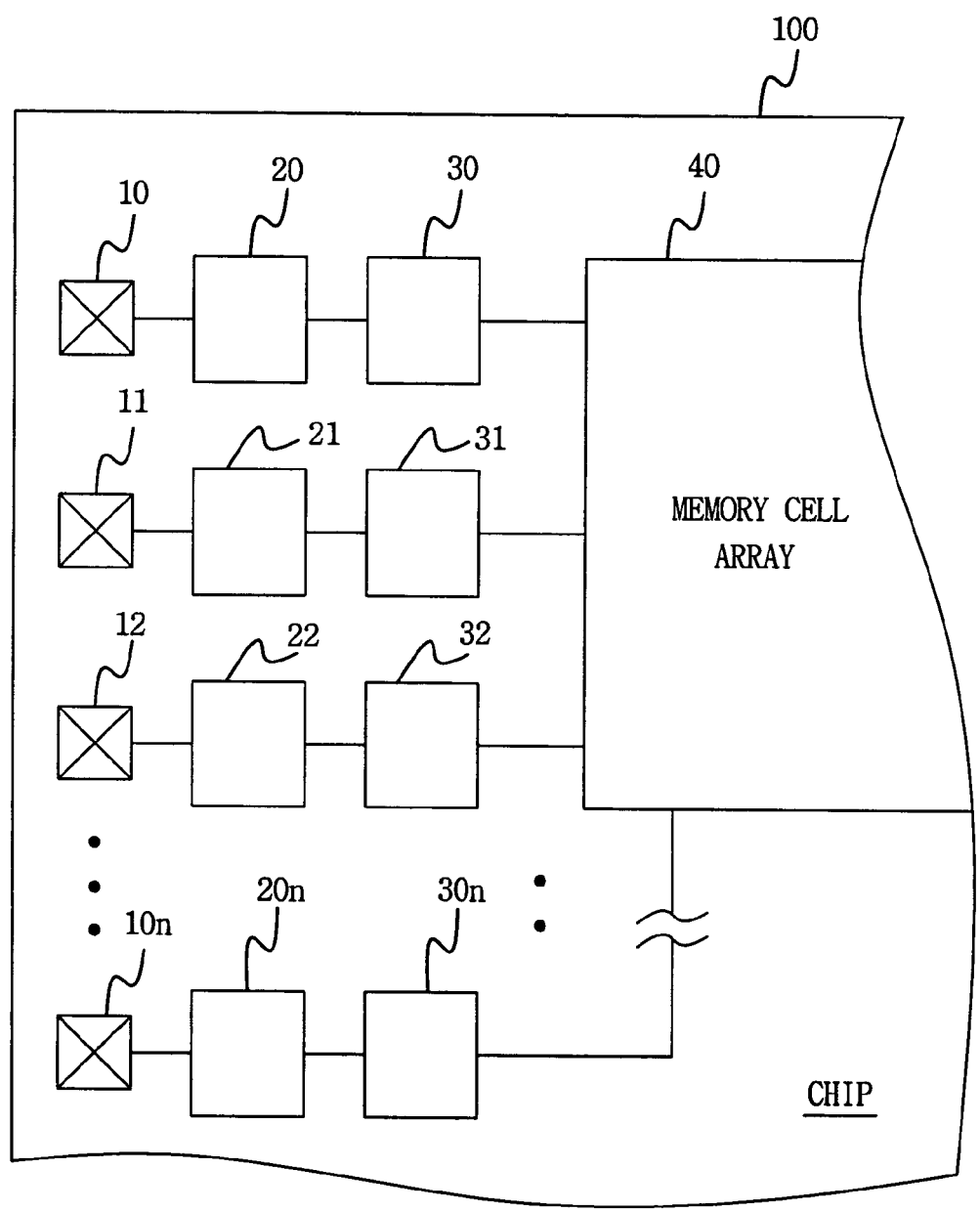
FIG. 3 is a block diagram illustrating pads of one of the circuit chips of FIG. 2, in accordance with the present invention.

FIG. 3 illustrates bonding pads of the chip 100 of FIG. 2. Referring to FIG. 3, the chip 100, constituting a semiconductor device, includes a plurality of pads 10–10n, a plurality of static discharge protective (ESD) elements 20–20n, and numerous internal circuits 30–30n. The numerous internal circuits 30–30n can, for example, be connected to a memory cell array 40.

Figure 4:
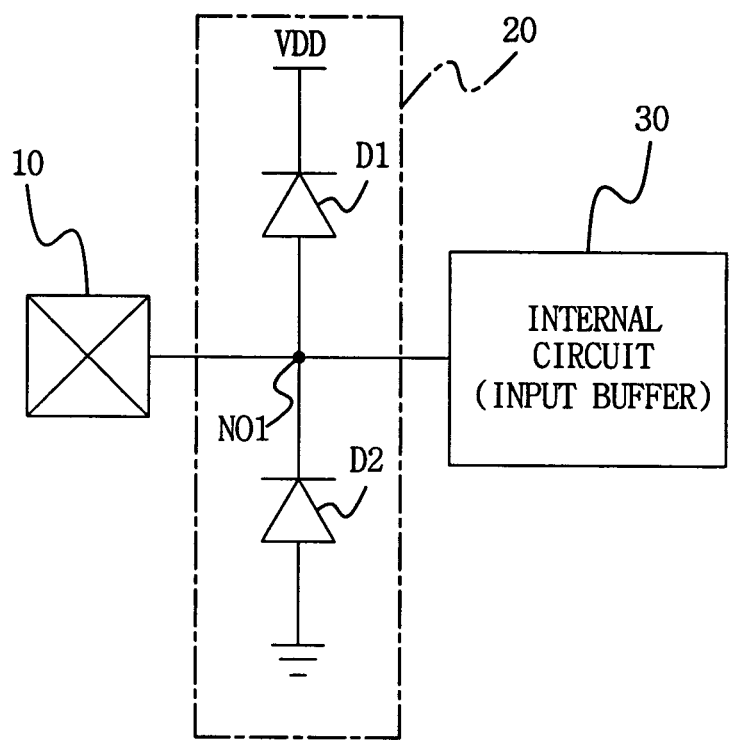
FIG. 4 is schematic diagram of a portion of the chip of FIG. 3, in accordance with the present invention.

FIG. 4 is a detailed circuit diagram of the interconnection of the pad 10, the static discharge protective element 20, and the internal circuit, e.g., the input buffer 30.

Test equipment of an EDS testing system is electrically coupled with the pads 10–10n of FIG. 3 via probe tips (not shown in the drawings) to perform an EDS test. One probe tip corresponds to, and is in contact with, one pad. When a chip test is completed, the probe tip is moved to test another chip, and comes in contact with a pad of another chip. In such a repetitive contact procedure, oxide alumina, a material of which the pads are formed, becomes stuck to the probe tip and contact resistance of the probe tip gradually increases. Thus, the present invention determines an optimized probe tip sanding period by monitoring this increase in contact resistance. Tip sanding is then performed at the determined optimized period, as described above with reference to FIG. 1.

Figure 5:
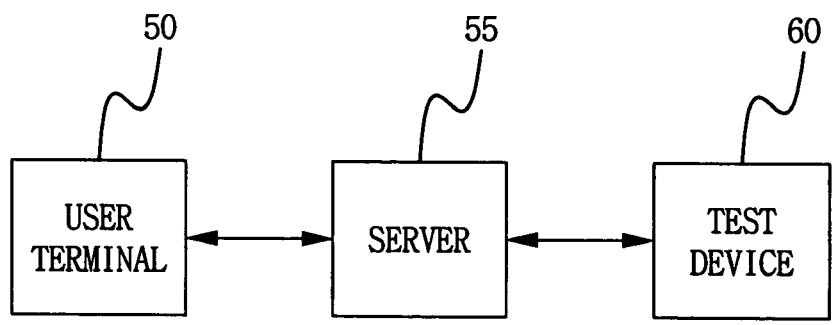
FIG. 5 is a block diagram of an EDS testing system according to an exemplary embodiment of the present invention.

Accordingly, in the invention, the increase in contact resistance is first monitored using a testing system such as the one depicted in FIG. 5, and then automatic sanding is executed.

FIG. 5 illustrates an EDS testing system according to an exemplary embodiment of the present invention. The system of FIG. 5 includes a user terminal 50, a server 55 and a test device 60. The user terminal 50 receives various kinds of commands from a test operator, and receives data and various determination values, and transmits the commands, the data and the values to the server 55.

The server 55 updates a test program condition in response to the commands and the determination values transmitted form the user terminal 50, and downloads the updated program to the test device 60. Further, the server 55 stores a program and various data for controlling the overall operation required for the EDS test, at an internal memory.

The test device 60 downloads a test program and the sanding program of the present invention from the server 55, monitors the increase in contact resistance of the probe tips, and applies an automatic sanding command to a sanding mechanism. The increase in contact resistance is monitored as a direct function of the amount of foreign substance that adheres to the probe tip during the testing cycles. The test device 60 of the present invention monitors the increase in contact resistance.

Figure 6:
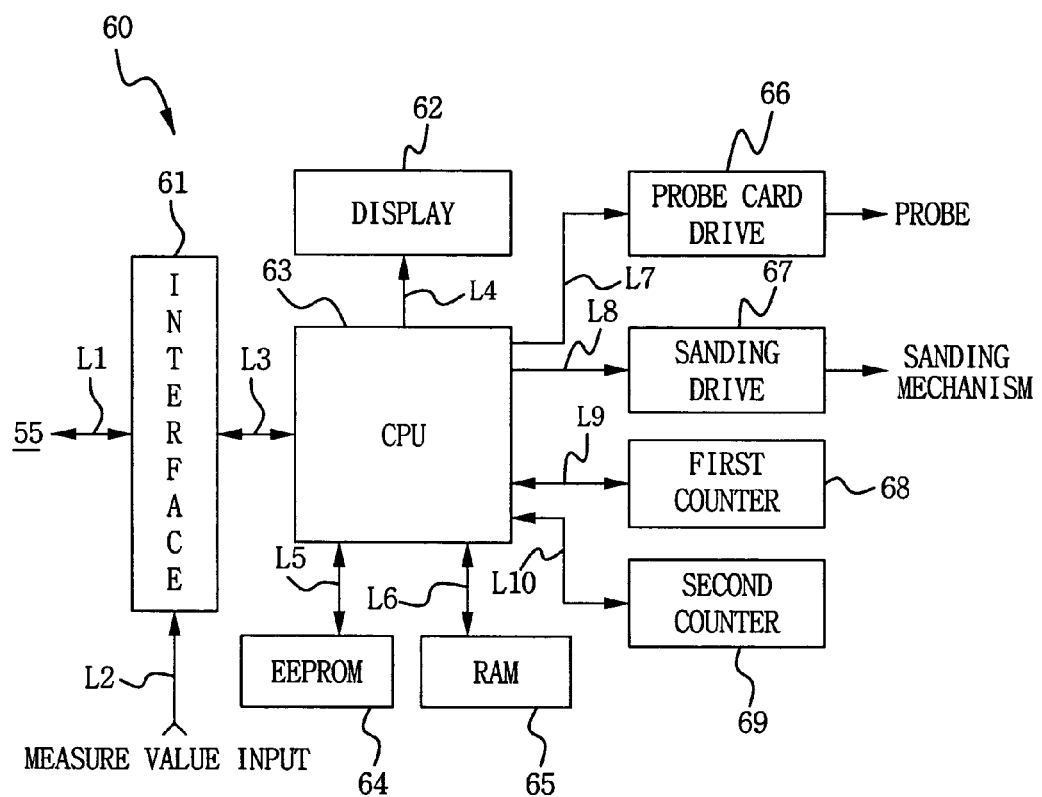
FIG. 6 is a block diagram of the test equipment of FIG. 5, in accordance with the present invention.

FIG. 6 is a detailed block diagram of the test device 60 of FIG. 5. The test device includes an interface 61 connected to the server 55 through a line L1, an EEPROM 64 for storing a program, a random access memory (RAM) 65 as a working memory, a display 62 for displaying test information, a probe card drive 66 for driving a probe card, a sanding drive 67 for polishing probe tips, first and second counters 68, 69 for storing counting data, and a CPU 63 controlling the operation of the various blocks, controlling the overall operation of the EDS test, and for controlling automatic sanding of the probe tips in response to increase in contact resistance. In the above diagram, resistance values measured at the pads of a chip under test are applied to an input line L2 of the interface 61.

Figure 7:
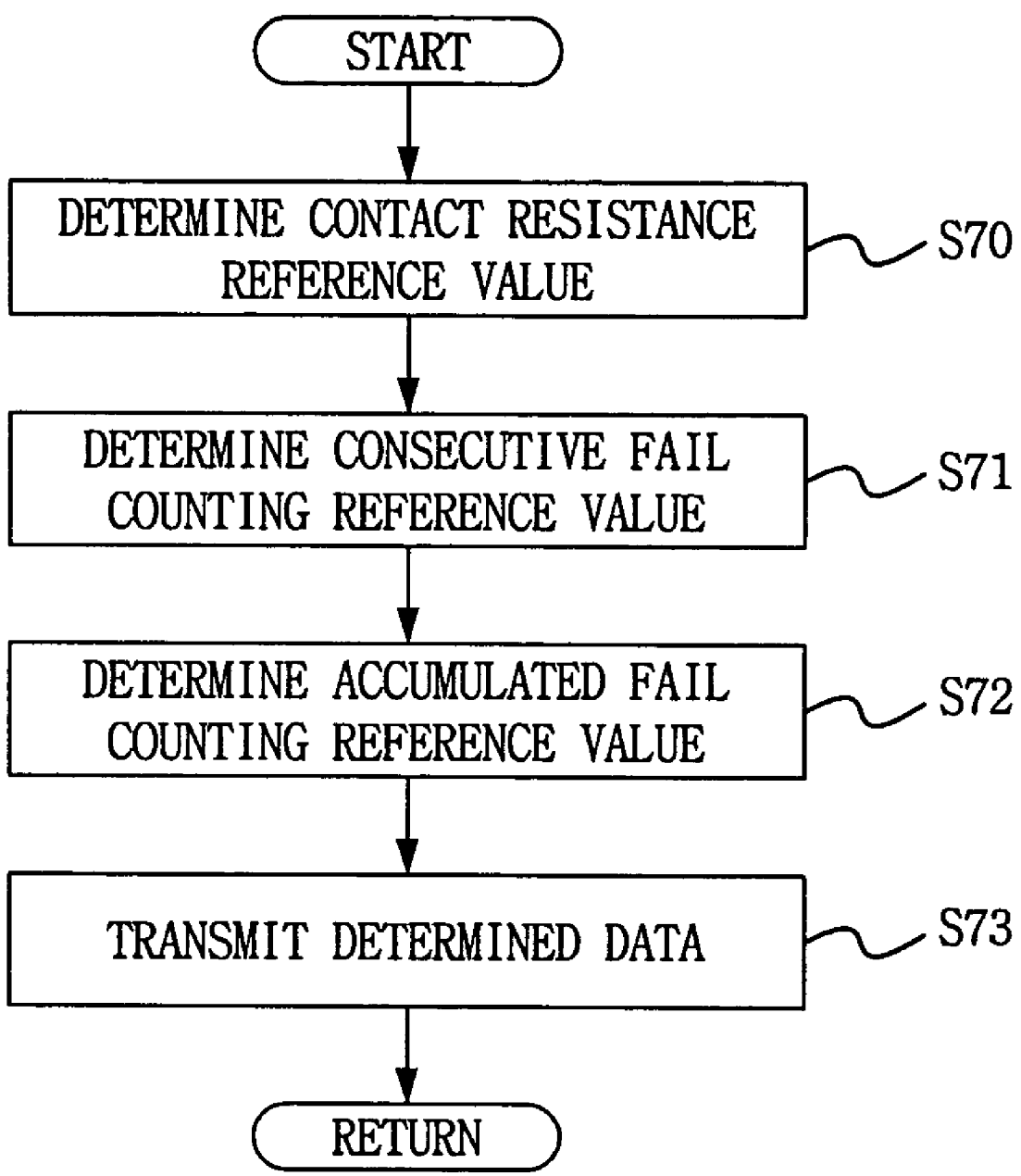
FIG. 7 is a flow diagram of operational control at the user terminal of FIG. 5, in accordance with the present invention.

FIG. 7 is a flow diagram depicting operational control at the user terminal 50 shown in FIG. 5. FIG. 7 includes the steps of determining a contact resistance reference value (S70), determining a consecutive fail counting reference value (S71), determining an accumulated fail counting reference value (S72), and transmitting the determined data (S73).

In FIG. 7, a test operator provides the contact resistance reference value, the consecutive fail counting reference value and the accumulated fail counting reference value, via the user terminal 50, or, alternatively, the test operator selects a specific value among values that are provided on selection menus. Following this, the steps S70,S71,S72 are performed by a controller within the user terminal 50. When the test operator activates the operation, for example by pressing a transmission key of a key input part, step S73 is executed such that the server 55 and the test device 60 receive the programmed data. Although a user terminal 50 connected to the server 55 was shown in the drawing, in a different case, the user terminal 50 can, alternatively, be connected directly to the interface 61 of the test device 60.

The contact resistance values of the plurality of pads 10–10n in the chip 100 are obtained by respectively measuring voltages after applying current to the pads 10–10n, the current being measured at the package level. All the resistance values of the pads 10–10n are summed, and the summed value is divided by the number of pads, to thereby gain a mean contact resistance value. In testing a new semiconductor product, a complementary mean contact resistance value is required. This value is obtained by summing an already determined resistance value with the mean contact resistance value, or by deducting the already determined resistance value from the mean contact resistance value. If the measured contact resistance value of the pad exceeds an allowed error range on the basis of the complementary mean contact resistance value, this case is determined as a contact failure.

The contact resistance reference value can be determined according to the following statistical technique. For example, in the midst of a pad open/short test for one or a plurality of dies in numerous chips 100, 101 on the wafer 110 of FIG. 2, resistance values measured by a resistance value measurement program are accumulated to gain a mean value, and then the mean value is summed with an allowance resistance error C. This summed value can be determined as the contact resistance reference value. In this case, the contact resistance reference value becomes the reference value as determined by statistics.

The consecutive fail counting reference value determines the number of times a contact failure is permitted and automatic sanding is then executed, for example, in the case where a contact failure occurs consecutively on adjacent dies. For example, assuming the consecutive fail counting reference value to be determined as 5 and then the contact failure occurs on five times on consecutive dies, the automatic sanding procedure is performed.

The accumulated fail counting reference value is provided to determine the number of times the accumulated number of contact failures are permitted. If the number of occurrences exceed the reference value, automatic sanding is then performed, in the event that contact failures occur irregularly on the numerous dies. For instance, assuming the accumulated fail counting reference value to be determined as 15 and then the contact failure occurs a total of fifteen times on testing dies, whether consecutively, or non-consecutively, the automatic sanding procedure is performed.

Such consecutive fail counting reference value and accumulated fail counting reference value are previously determined by statistical data.

Figure 8:
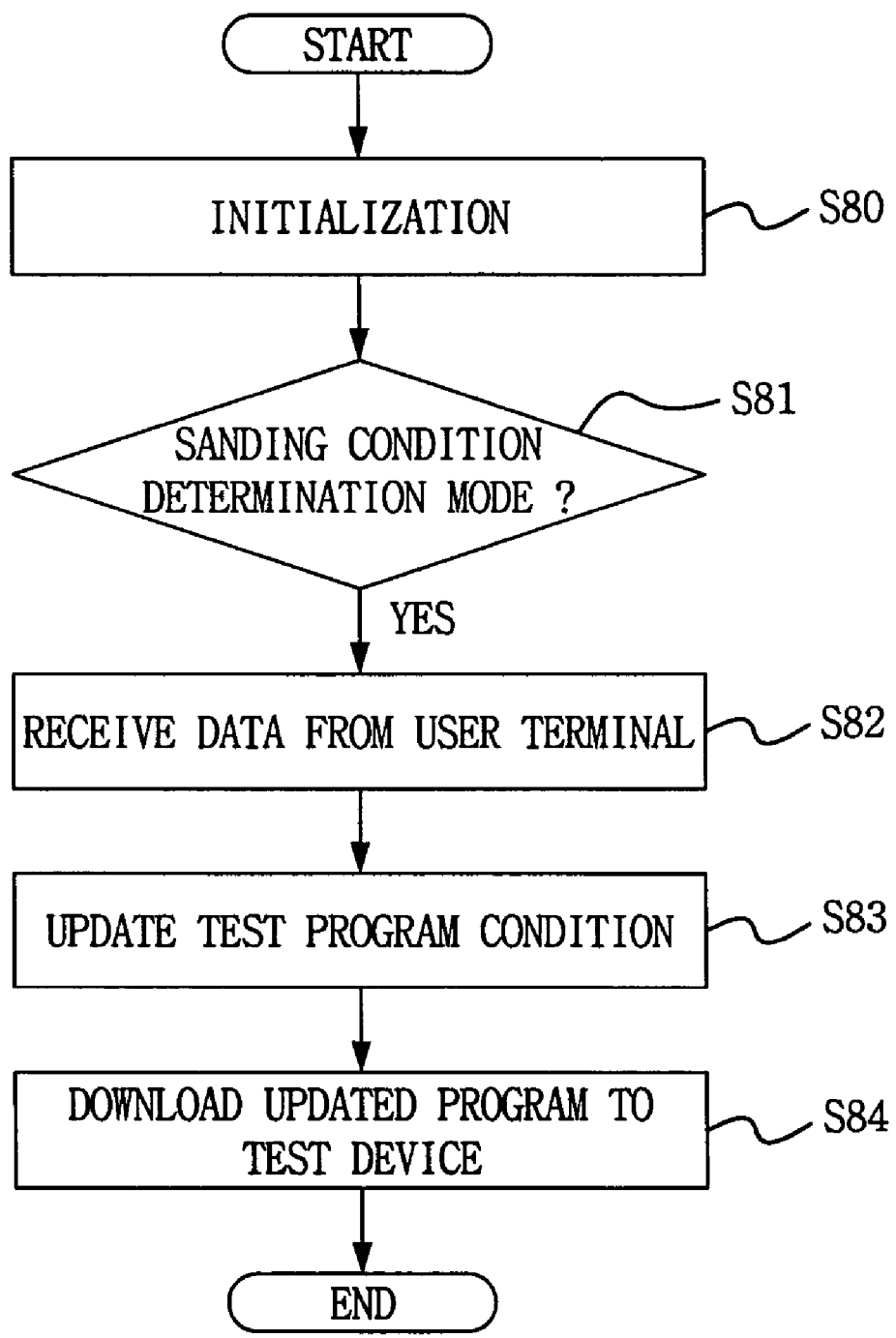
FIG. 8 is a flow diagram of the operational control at the server of FIG. 5, in accordance with the present invention.

FIG. 8 is a flow diagram illustrating operational control of the server 55 shown in FIG. 5. A controller of the server is initialized (S80). Next, data is received from the user terminal (s82) when a sanding condition determination mode (S81) is determined. The test program condition is updated (S83), and the updated program is transmitted and downloaded to the test device (S84).

Figure 9:
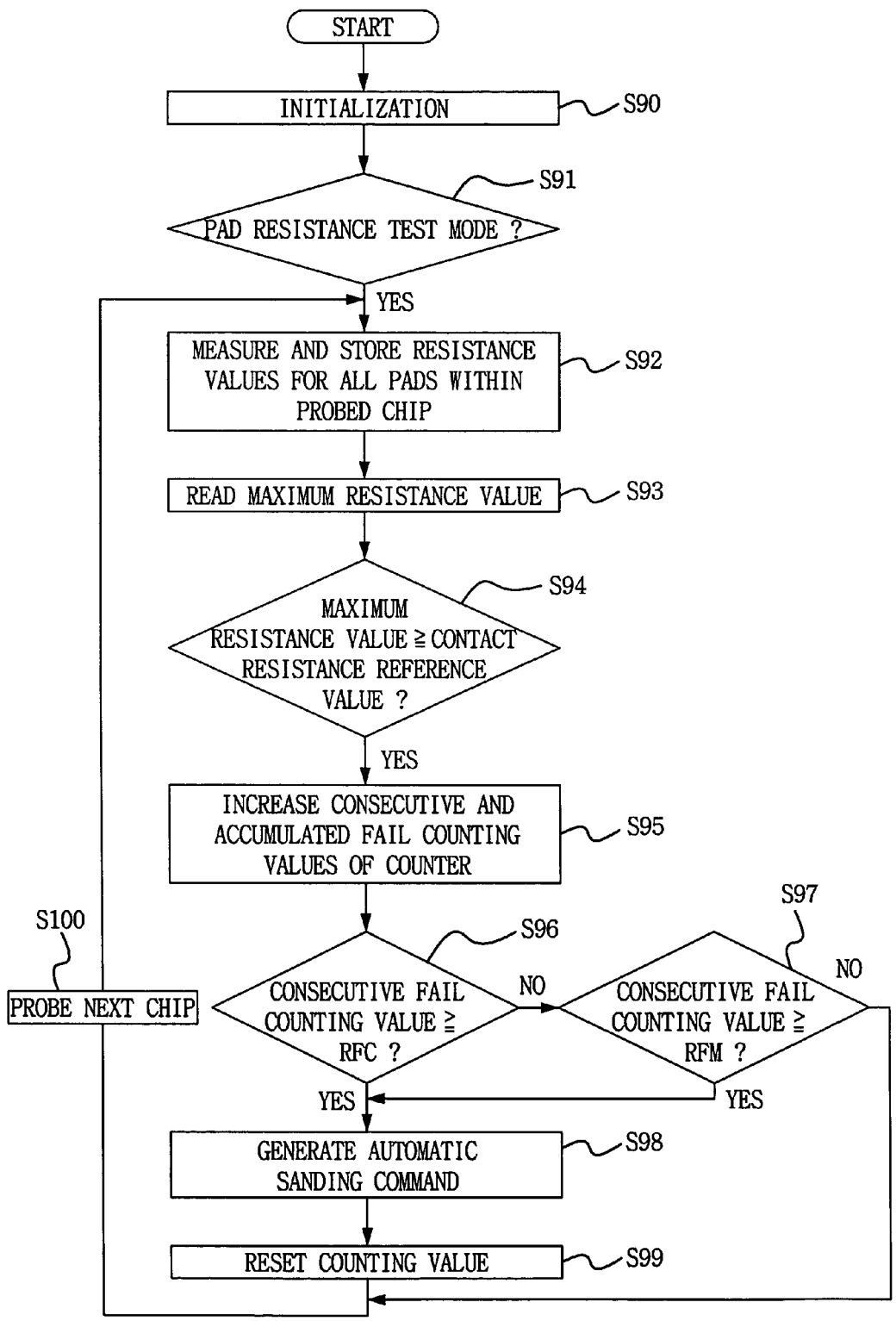
FIG. 9 is a flow diagram illustrating control of probe tip sanding of test equipment, in accordance with the present invention.

FIG. 9 is a flow diagram illustrating a process for probe tip sanding control of the test device in accordance with the present invention, and includes the steps S90 through S100. Referring to FIG. 9, the CPU 63 of FIG. 6 is initialized (S90), and several registers and counters are set by an initial value. The CPU 63 determines whether the mode of operation is a pad resistance test mode (S91). Entrance to the pad resistance test mode is obtained, for example, when an operator of the device inputs a command through the user terminal or, alternatively, a command is automatically generated in an EDS test mode. When the mode of operation is the pad resistance test mode, resistance values for all pads within a probed chip are measured and stored (S92). At this time, a measured value for contact resistance is applied to the interface 61 through the input line L2 of FIG. 6. The CPU 63 receives the contact resistance measure values, for example in digital form, in series or in parallel through a line L3, and stores the values at storage regions of the memory 65. When the resistance measurement of the pads of one die on the wafer is completed, the CPU 63 accesses the storage regions and reads a maximum resistance value among the stored measured contact resistance values (S93). The read maximum resistance value is compared with the determined contact resistance reference value (S94). When the maximum resistance value is greater than the contact resistance reference value, the CPU 63 applies an enable signal to first and second counters 68, 69 so as to increase the consecutive fail counting value and the accumulated fail counting value (S95).

If the consecutive or accumulated fail counting value is greater than each corresponding determined number reference value RFC, RFM (S96, S97), then the CPU 63 generates an automatic sanding command so as to execute an automatic sanding operation of the probe tip (S98). The CPU 63 applies a drive signal to the sanding drive 67 through a line L8, to thus embody such a probe tip sanding command. As a result, the sanding drive 67 drives a sanding mechanism so as to perform automatic sanding of the probe tip. The number reference values RFC, RFM respectively correspond to the consecutive fail counting value and the accumulated fail counting value, as described above. The CPU 63 applies a reset signal to the first and second counters 68, 69 so as to reset the counting values (S99). The pad resistance test for one die is therefore completed, and probing of the next chip is performed irrespective of whether an automatic sanding command (S100) was generated. At this time, the CPU 63 controls the probe card drive 66 through a line L7, and the probe card drive 66 drives the probe card.

If initial failures consecutively occur in the EDS test, this case is regarded as a basic set-up excess state in the sanding condition. To double check whether a failure has actually occurred in this condition, a function of re-testing from a first die following the automatic sanding can be added to the process to reduce the occurrence of false negative test results.

In addition, although the invention was described in conjunction with an intelligent sanding system (ISS) mode in the operation steps of FIG. 9, the present invention can alternatively be configured to convert from the initial normal mode to the ISS mode when failure readings exceed the determined number of dies.

The control flow of the probe tip sanding in FIG. 9 represents an accurate probe tip sanding at an opportune time on the basis of statistical data. Therefore, the occurrence of false negative readings of the tested semiconductor devices caused due to erroneous measurement of the pad resistance in an open/short test or in an analog item test can be minimized. In addition, increase in the amount of time allocated to sanding and reduction in the useful life of a probe tip, due to frequent sanding, is mitigated.

Consequently, under the inventive ISS test method and system, the sanding period is determined by an observational and statistical method through an operator's discretion and a statistical result, instead of a conventional experiential and non-statistical sanding period that is determined exclusively by the test operator. Accordingly, the problem of false negative readings for testing of chips on a wafer can be mitigated and verification for an analog block can be performed accurately.

As afore-mentioned, in accordance with the present invention, the effects of hindrance of normal contact during testing is removed in an EDS test, and thus device yield can be improved. In addition, probe tip sanding is executed periodically at an appropriate time period, to thus minimize the amount of time consumed by tip sanding, optimize the useful life of a probe tip, and improve the equipment operating rate.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of controlling probe tip sanding in semiconductor device testing equipment, the method comprising:

measuring and storing resistance values of pads of a probed chip;

increasing a consecutive fail counting value and an accumulated fail counting value when a maximum resistance value among the stored resistance values is greater than a contact resistance reference value; and generating an automatic sanding command to activate automatic sanding of a probe tip, when at least one of the consecutive fail counting value and the accumulated fail counting value is greater than a respective counting reference value.

2. The method of claim 1 wherein measuring and storing resistance values of pads of a probed chip occurs at a wafer level.

3. The method of claim 1, wherein the contact resistance reference value is determined by:

accumulating the resistance values measured by a resistance value measure program and obtaining a mean value during a pad open/short test for at least one die; and summing the mean value with an allowed resistance error value.

4. The method of claim 1, wherein said counting reference value corresponding to the consecutive fail counting value is determined statistically.

5. The method of claim 1, wherein said counting reference value corresponding to the accumulated fail counting value is determined statistically.

6. The method of claim 1, wherein said probe tip sanding is performed in an EDS test process.

* * * * *